(12) United States Patent
Won et al.

(10) Patent No.: US 6,498,764 B1
(45) Date of Patent: Dec. 24, 2002

(54) FLASH MEMORY DEVICE HAVING A MULTI-BANK STRUCTURE

(75) Inventors: Sam Kyu Won, Busan-Shi (KR); Min Kyu Kim, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/026,939

(22) Filed: Dec. 27, 2001

(30) Foreign Application Priority Data

Nov. 23, 2001 (KR) .......................................... 01-73421

(51) Int. Cl.[7] ................................................ G11C 8/00
(52) U.S. Cl. ........................... 365/230.03; 365/189.09; 365/210
(58) Field of Search ................... 365/185.03, 230.03, 365/230.08, 196, 189.09, 210

(56) References Cited

U.S. PATENT DOCUMENTS 6,157,580 A * 12/2000 Kohno .................. 365/189.09
6,160,750 A * 12/2000 Shieh .................... 365/230.03
6,240,040 B1 * 5/2001 Akaogi et al. ......... 365/185.11
6,327,181 B1 * 12/2001 Akaogi et al. ......... 365/185.11

\* cited by examiner

*Primary Examiner*—David Nelms
*Assistant Examiner*—Thong Le
(74) *Attorney, Agent, or Firm*—Morgan, Lewis & Bockius LLP

(57) ABSTRACT

A flash memory device includes a plurality of banks having a memory cell array and a row and column decoder, a system for classifying an input address into a read address and a write address depending on read or write operation, a first selecting system for enabling one of the plurality of the banks depending on the bank address allocated to the input address and the read address to perform the read operation, a second selecting system for enabling one of the plurality of the banks depending on the bank address allocated to the input address and the write address to perform the write operation, a sense amplifier for sensing data of the bank to compare them with data of a reference cell, and a pumping system for supplying a given bias to the bank.

4 Claims, 4 Drawing Sheets

FLASH MEMORY DEVICE HAVING A MULTI-BANK STRUCTURE

BACKGROUND OF THE INVENTION

1. Field of the Invention

The invention relates generally to a flash memory device of a multi-bank structure, and more particularly to, a flash memory device of a multi-bank structure capable of allowing a dual operation without increasing the area of the multi-bank structure of more than 2-bank, by discriminating a read address and a write address depending respective operations and determining the banks depending on the bank address allocated in an input address.

2. Description of the Prior Art

In order to implement higher-speed and higher-integration semiconductor memory devices, a plurality of memory cell arrays are constituted in a plurality of blocks and the plurality of blocks are arranged in a row and column direction to form a single bank. Generally, a single bank includes a memory cell array, a raw and column decoder and a pass gate.

FIG. 1 is a block diagram showing a conventional 2-bank flash memory device far implementing a dual operation. The structure and operation of the 2-bank flash memory device will be below explained.

An address latch means 102 that receives an address ADDR buffered in an address buffer 101, outputs a first bank address BANK1 ADDR and a second bank address BANK2 ADDR. A first bank row decoder 103 and a first bank column decoder 104 both constituting a first bank 10 selects a first bank memory cell array 107 and a first pass gate 108 depending on the first bank address BANK1 ADDR from the address latch means 102 to select a given cell of the first bank memory cell array 107. Meanwhile, a second bank row decoder 105 and a first bank column decoder 106 both constituting a second bank 20 selects a second bank memory cell array 110 and a second pass gate 111 depending on the second bank address BANK2 ADDR from the address latch means 102 to select a given cell of the second bank memory cell array 110. A first sense amplifier 109 senses the selected cell of the first bank memory cell array 107 to output its result, and a second sense amplifier 112 senses the selected cell of the second bank memory cell array 110 to output its result. The output results of the first and second sense amplifiers 109 and 112, are outputted outside through a data latch means 113 and an input/output buffer 114.

As above, the reason that the first and second bank addresses BANK1 ADDR and BANK2 ADDR are divided is to implement a dual operation far allowing the first bank 10 and the second bank 20 to perform separate operations. In other words, that is because an address for discriminating that the second bank 20 performs a read operation while the first bank 10 performs a write operation is necessary.

Therefore, in order to implement a dual operation in a multi-bank of more than 2-bank constructed above, an address bus line is increased by the number of the bank since the number of address is required as much as the number of the bank. For example, assuming that the number of address is twenties (20), forties (40) number of address bus lines is required in the 2-bank but if it is 4-bank, eighties (80) number of address bus lines are required.

SUMMARY OF THE INVENTION

The present invention is contrived to solve the above problem and an object of the present invention is therefore to provide a flash memory device of a multi-bank structure capable of improving .the performance of devices by effectively constructing a dual operation without increasing the area of the multi-bank of more than 2-bank.

Another object of the preset invention is to a multi-bank semiconductor memory device for allowing a dual operation, by discriminating a read address and a write address depending respective operations and determining the banks depending on the bank address allocated in an input address.

In order to accomplish the above object, a semiconductor memory device of a multi-bank structure according to the present invention is characterized in that it comprises a plurality of banks having a memory cell array and a row and column decoder; a means for classifying an input address into a read address and a write address depending on read or write operation; a first selecting means for enabling one of the plurality of the banks depending on the bank address allocated to the input address and the read address to perform the read operation; a second selecting means for enabling one of the plurality of the banks depending on the bank address allocated to the input address and the write address to perform the write operation; a sense amplifier for sensing data of the bank to compare them with data of a reference cell; and a pumping means for supplying a given bias to the bank.

Also, the semiconductor memory device of a multi-bank structure further includes a first switching means connected between the plurality of the banks and the sense amplifier and driven depending on a control signal of the first selecting means.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
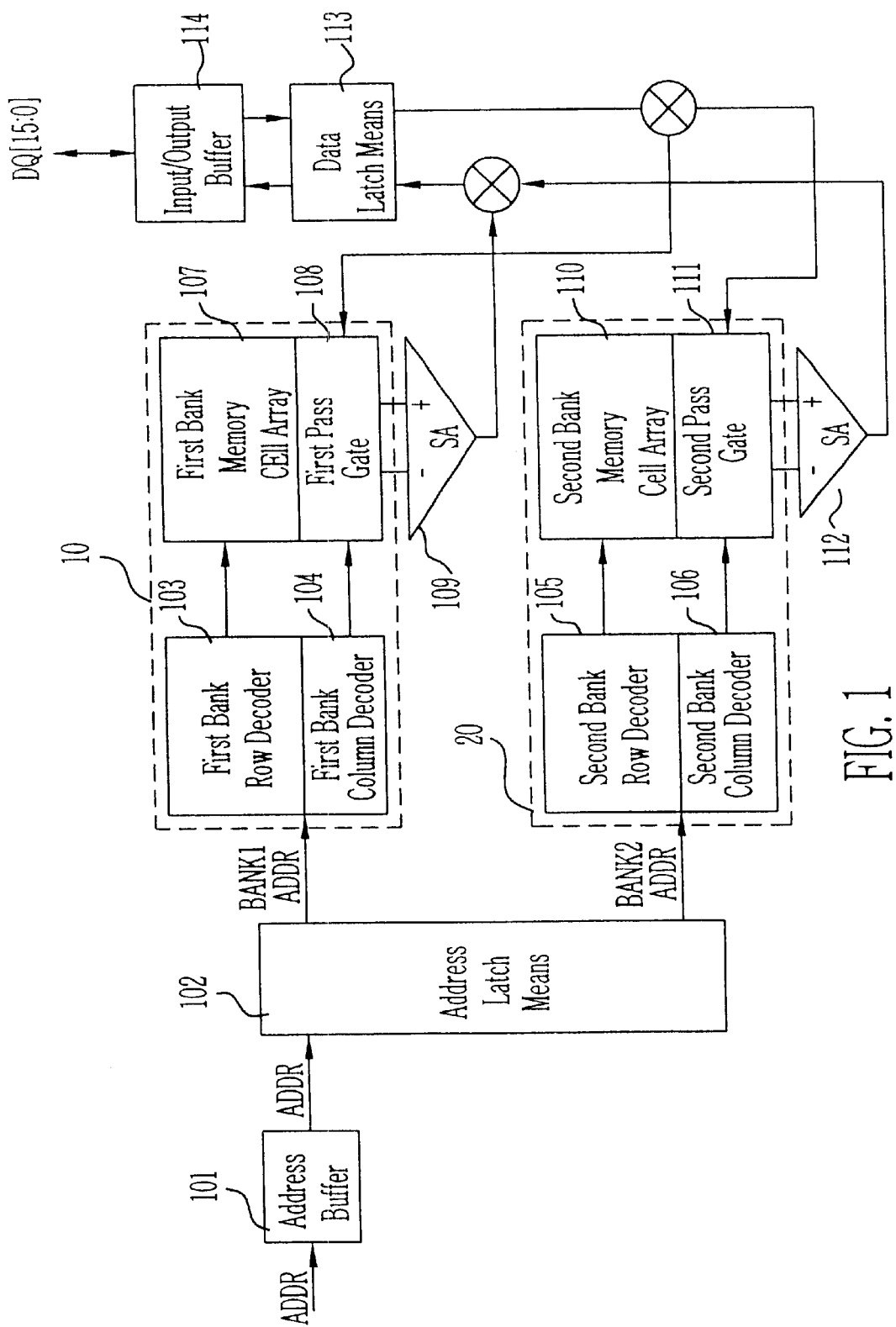
FIG. 1 is a block diagram of a conventional 2-bank flash memory device.

The present invention will be described in detail by way of a preferred embodiment with reference to accompanying drawings, in which like reference numerals are used to identify the same or similar parts.

Figure 2:
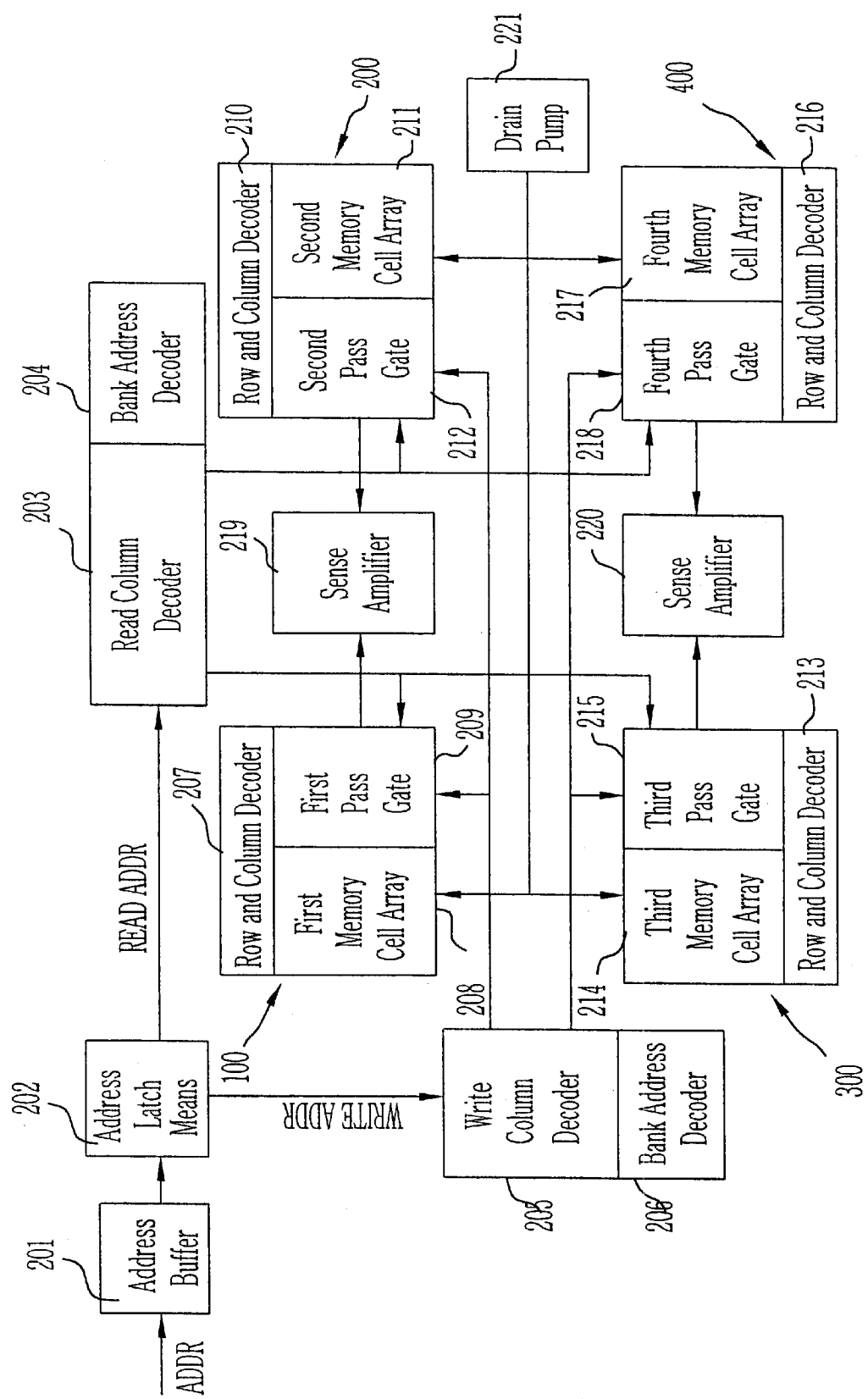
FIG. 2 is a block diagram of a multi-bank flash memory device according to the present invention.

FIG. 2 is a block diagram showing a multi-bank flash memory device according to the present invention. A structure and operation of the multi-bank flash memory device will be below described in detail.

An address latch means 202 receives an address ADDR buffered in an address buffer 201 to classifies it into a read address READ ADDR and a write address WRITE ADDR depending an a read and write operation. If the address classified by the address latch means 202 is a read address READ ADDR depending on the read operation, a read column decoder 203 and a bank address decoder 204 enables one of first~fourth banks 100~400 to perform the read operation. At this time, the bank address decoder 204 selects a given bank depending on a bank address allocated to the input address ADDR. Each of the first~fourth banks 100~400 includes row and column decoders 207, 210, 213 and 216, memory cell arrays 208, 211, 214 and 217 and pass gates 209, 212, 215 and 218. If a bank is selected in order to perform a read operation, a row and column decoder corresponding to the bank selects a given cell of the memory cell array and the pass gate to sense data of the selected memory cell using sense amplifiers 219 and 220. Meanwhile, if the address classified by the address latch means 202 is a write address WRITE ADDR depending on the write operation, the write column decoder 205 and the bank address decoder 206 enables one of the first~fourth banks 100~400 to perform the write operation. At this time, a given bias generated in the drain pump 221 is supplied to a drain terminal of each of the cells of the memory cell array.

Figure 3:
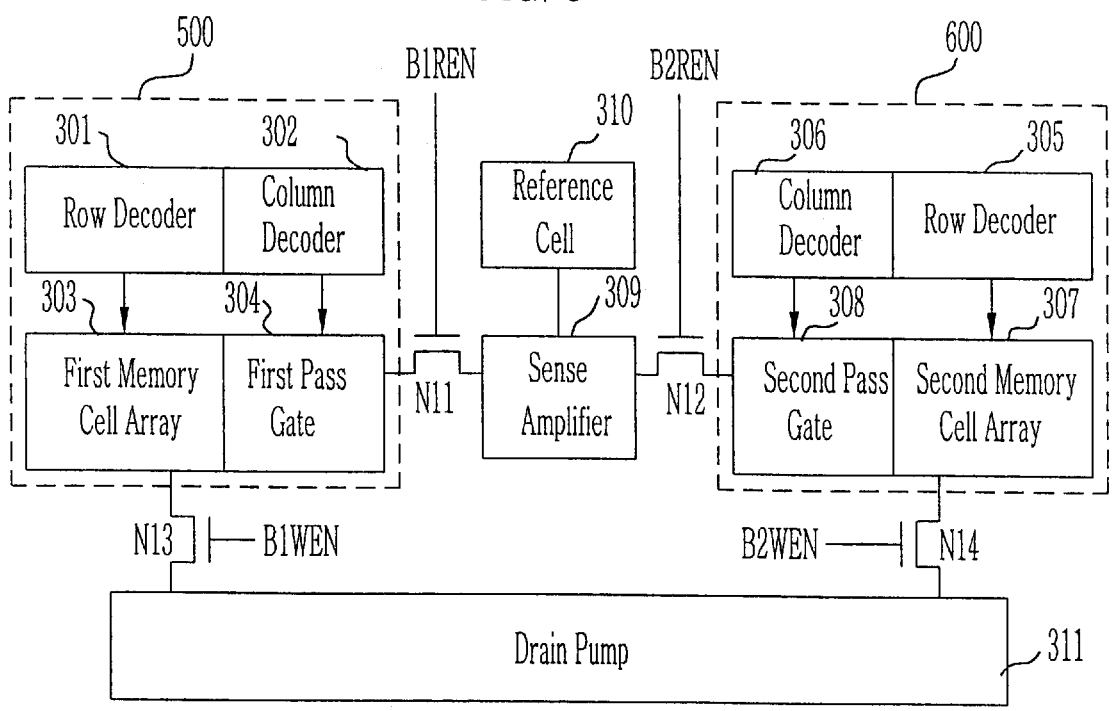
FIG. 3 is a block diagram showing a part of the multi-bank flash memory device according to the present invention.

FIG. 3 is a block diagram of a 2-bank flash memory device for a dual operation according to the present invention, which shows the relationship between the bank, the drain pump and the sense amplifier.

As can be seen from FIG. 3, the 2-bank flash memory device for a dual operation includes first and second banks 500 and 600, a sense amplifier 309 for sensing data of the memory cell to compare it with data of a reference cell 310, and a drain pump 311 for supplying a given bias to a drain terminal of the memory cell. The first and second banks 500 and 600 includes row decoders 301 and 305, column decoders 302 and 306, memory cell arrays 303 and 307, and pass gates 304 and 308. Also, a first NMOS transistor N11 is connected between the first bank 500 and the sense amplifier 309 and is driven depending on a first bank read enable signal B1REN and a second NMOS transistor N12 is connected between the second bank 600 and the sense amplifier 309 and is driven depending on a second bank read enable signal B2REN. Further, a third NMOS transistor N13 is connected between the first bank 500 and: the drain pump 311 and is driven depending on the first bank write enable signal B1WEN and a fourth NMOS transistor N14 is connected between the second bank 600 and the drain pump 311 and is driven depending on a second bank write enable signal B2WEN.

In the above construction, if the first bank 500 is selected in order to perform the write operation, the first bank read enable signal B1REN is applied with a HIGH state to turn on the first NMOS transistor N11 and the second hank read enable signal B2REN is applied with a LOW stag to turn off the second NMOS transistor N12. Therefore, cell data of the memory cell array 303 in the first bank 500 is inputted to the sense amplifier 309 through the turned-on first NMOS transistor N11 The sense amplifier 309 compares the cell data and data of the reference cell 310 to output its result.

In the above read state, in order to write the second bank, the second bank write enable signal B2WEN is applied with a HIGH state to turn on the fourth NMOS transistor N14 and the first bank write enable signal B1WEN is applied with a LOW state to turn off the third NMOS transistor N13. Therefore, a given bias generated from the drain pump 311 is applied to the first bank 500 through the turned-on fourth NMOS transistor N14. However, a single bank could not perform the write and read operation at the same time. In other words, the read enable signal and the write enable signal could not be simultaneously inputted to a single bank.

Figure 4:
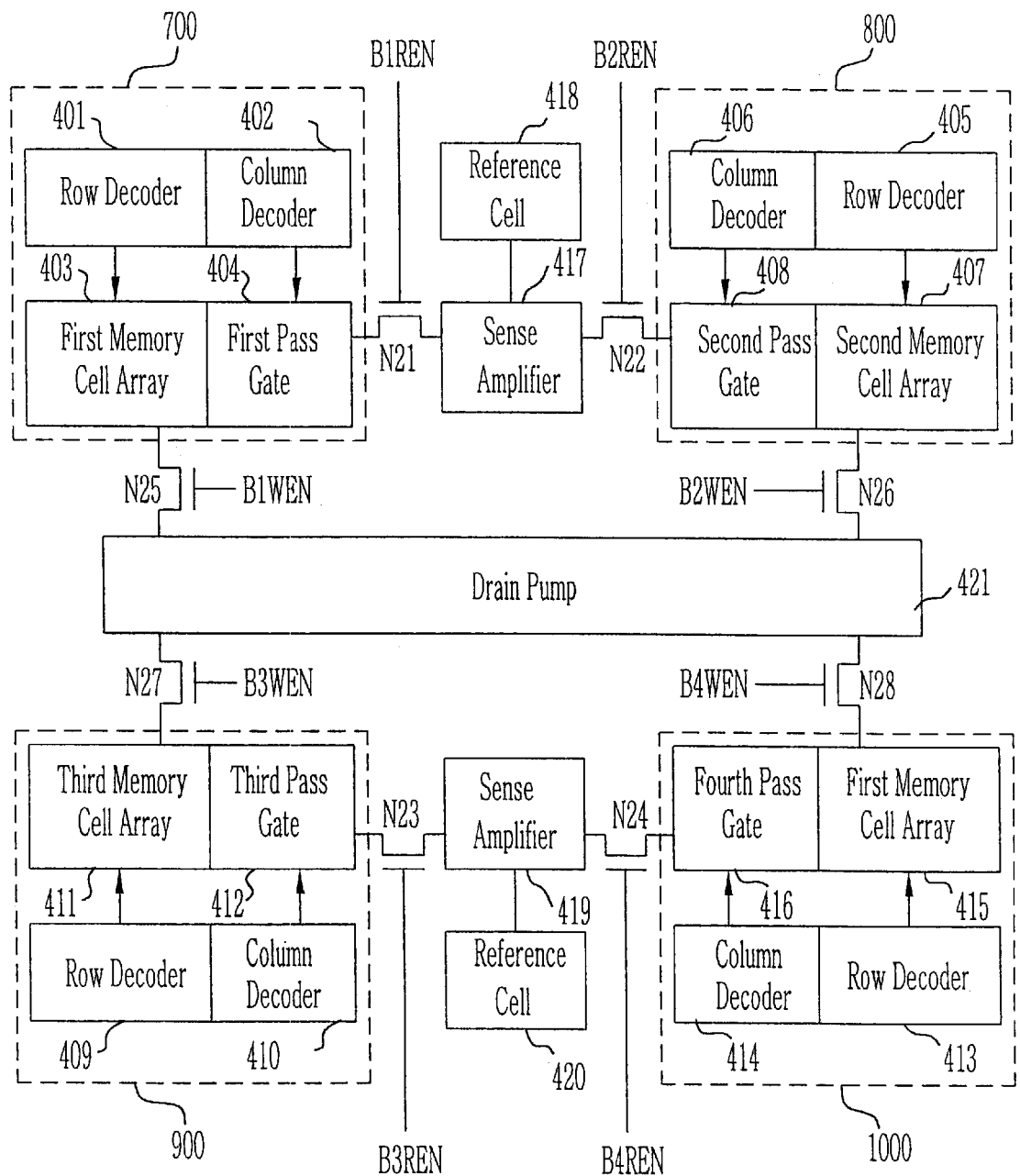
FIG. 4 is a block diagram showing a part of a 4-bank flash memory device according to another embodiment of the present invention.

FIG. 4 is a block diagram of a multi-bank flash memory device for a dual operation according to another embodiment of the present invention, which shows the relationship between the bank, the drain pump and the sense amplifier in which the write enable signal and the read enable signal are inputted to respective 4 banks. FIG. 4 is that the structure and operation of the 2 banks are applied to the 4 banks.

As can be seen from the drawing, the multi-bank flash memory device includes first~fourth bank 700~1000, sense amplifiers 417 and 419 for sensing data of the memory cell to compare them with data of reference cells 418 and 420, and a drain pump 421 for supplying a given bias to a drain terminal of the memory. Each of the first~fourth banks 700~1000 includes row decoders 401, 405, 409 and 413, column decoders 402, 406, 410 and 414, memory cell arrays 403, 407, 411 and 415, and pass gates 404, 408, 412 and 416. Also, first~fourth NMOS transistors N21~N24 are connected between the first~fourth banks 700~1000 and the sense amplifiers 417 and 419 and are driven depending on first~fourth bank read enable signals B1REN, B2REN, B3REN and B4REN, respectively. Further, fifth~eighth NMOS transistors N25~N28 are connected between the first~fourth banks 700~1000 and the drain pump 421 and are driven depending on first~fourth bank write enable signals B1WEN, B2WEN, B3WEN and B4WEN, respectively.

As mentioned above, the present invention classifies an input address into a read address and a write address depending on respective operations and discriminates banks depending on the bank address allocated by the input address. Therefore, the present invention has an advantage that it allows a dual operation to improve the performance of a chip without increasing the area of the multi-bank construction of more than 2 banks.

The present invention has been described with reference to a particular embodiment in connection with a particular application: Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device of a multi-bank structure, comprising:

a plurality of banks, each having a memory cell array including a plurality of memory cells, a row decoder and a column decoder;

a means for classifying an input address into a read address and a write address depending on one of read and write operations;

a first selecting means for selecting a bank depending on a bank address allocated to the input address and the read address to perform the read operation;

a second selecting means for selecting another bank depending on the bank address allocated to the input address and the write address to perform the write operation;

a sense amplifier for comparing data of said selected banks with data of a reference cell; and a pumping means for supplying a given bias directly to drain terminals of earn of the memory cells.

2. The device according to claim 1, further including a first switching means connected between the plurality of banks and the sense amplifier, and driven depending on a control signal of the first selecting means.

3. The device according to claim 1, further including a second switching means connected between the plurality of banks and the pumping means, and driven depending an a control signal of the second selecting means.

4. The device according to claim 1, wherein the first and second selecting means do not simultaneously select a same bank of the plurality of the banks.

* * * * *